United States Patent [19]
Aigo

[11] Patent Number: 4,661,653
[45] Date of Patent: Apr. 28, 1987

[54] PACKAGE ASSEMBLY FOR SEMICONDUCTOR DEVICE

[76] Inventor: Seiichiro Aigo, 3-15-13, Negishi, Daito-ku, Tokyo, Japan

[21] Appl. No.: 686,696

[22] Filed: Dec. 27, 1984

[51] Int. Cl.[4] .............................................. H01L 23/04
[52] U.S. Cl. .................. 174/52 FP; 361/401
[58] Field of Search ............. 174/52 R, 52 P, 52 FP; 361/401, 405; 357/75; 235/488, 492

[56] References Cited

U.S. PATENT DOCUMENTS

| | | | |
|---|---|---|---|
| 3,480,836 | 11/1969 | Aronstein | 361/401 X |
| 3,504,096 | 3/1970 | Nagel | 174/52 FP |
| 3,520,054 | 7/1970 | Pensack et al. | 174/52 FP X |
| 3,981,074 | 9/1976 | Yamamoto et al. | 174/52 FP X |
| 4,417,413 | 11/1983 | Hoppe et al. | 235/488 X |
| 4,511,796 | 4/1985 | Aigo | 361/401 X |
| 4,539,622 | 9/1985 | Akasaki | 361/401 |

FOREIGN PATENT DOCUMENTS 0134456  8/1983  Japan ....................................... 357/75

*Primary Examiner*—Arthur T. Grimley
*Assistant Examiner*—D. A. Tone
*Attorney, Agent, or Firm*—Wegner & Bretschneider

[57] ABSTRACT

Disclosed herein is a package assembly for a semiconductor device or devices. The package assembly has a ceramic package body and at least one ceramic cover plate. The package body has a circular outer periphery provided with a plurality of projections to be fitted in grooves formed in an inner peripheral surface of a base board, and a plurality of connector terminals on the surface of the body. Also, the package body is formed with a stepped portion or portions in the rear face thereof. The cover plate or plates are sealed to the stepped portion or portions by pastes applied to both the cover plate and the stepped body portion. This ceramic package assembly enables compactness, moisture-proof complete seal and easy mounting thereof.

6 Claims, 8 Drawing Figures

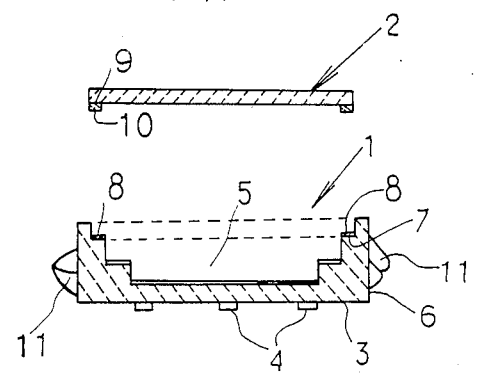
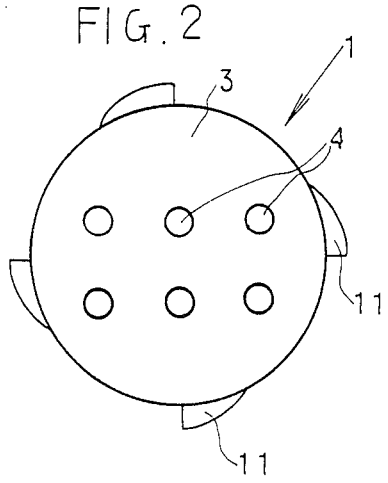
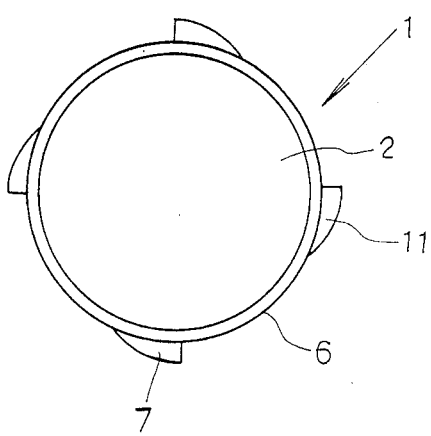
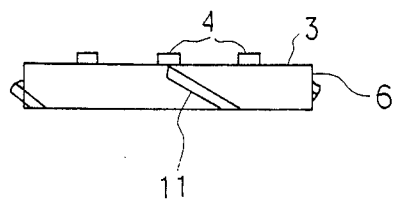

PACKAGE ASSEMBLY FOR SEMICONDUCTOR DEVICE

FIELD OF THE INVENTION

This invention relates to an improvement in or relating to a package assembly in which semiconductor device or devices such as so called IC, LSI, etc, are encased.

The package assembly including semiconductor device or devices is positioned in a base board such as a printed circuit board, an identification card or the like. This type of package assembly has been made of metal sheet, molded resin, ceramics, etc.

BACKGROUND OF THE INVENTION

In a commonly accepted technique, a package assembly for semiconductor device or devices has straight-linear or right-angled lead frames projected therefrom. These lead frames are attached to corresponding electrical terminals by means of soldering or socket-manner fitting. Accordingly, such a package assembly can not be easily mounted on a base board. And, a package assembly mounted on a base board is relieved from the surface of the board, which hinders compactness. Also, the package assembly provided with lead frames can not be positioned in an identification card, and thus its application is limited. Semiconductor devices encased in molded resin will suffer from moisture. My invention overcomes the above described defects in the prior art technique.

SUMMARY OF THE INVENTION

Therefore, an object of the invention is to provide an improved ceramic package assembly for semiconductor device or devices, which enables easy mounting, compactness and complete seal.

In attaining the above described object of the invention, a package assembly of the invention comprises a ceramic package body and at least one ceramic cover plate. This body has a circular outer periphery provided with a plurality of projections to be fitted in grooes formed in an inner peripheral surface formed in a base board, and a plurality of connector terminals on the surface of the body. Also, a stepped portion or portions in which semiconductor device or devices are positioned, are formed in the rear face of the body. The cover plate or plates are sealingly adhered to be stepped portion or portions by means of pastes applied to both the cover plate and the stepped portion.

BRIEF DESCRIPTION OF THE DRAWINGS

FIG. 1 is an inverted exploded sectional view of a package assembly embodied by the invention;

FIG. 2 is a plan view of the package assembly shown in FIG. 1;

FIG. 3 is a bottom plan view of the assembly;

FIG. 4 is a side elevational view of the assembly;

DESCRIPTION OF THE PREFERRED EMBODIMENTS

Figure 5:
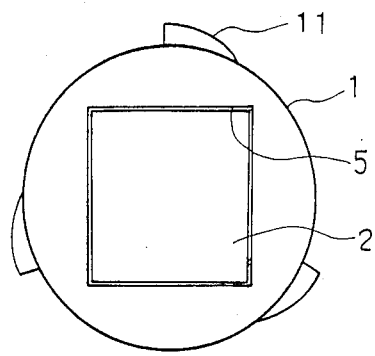
FIG. 5 is a bottom plan view showing another embodiment of the invention.

I will now describe the embodiments of the invention with reference to the attached drawings. FIGS. 1 to 4 illustrate a preferred embodiment of a package assembly according to the invention. In the figures, 1 denotes a package body, and 2 denotes a cover plate. Both of them are made of ceramics. Preferably, the body 1 is of a multi-layered structure consisted of so-called "green ceramics" and circuits are formed among the layers. A plurality of connector terminals 4 are disposed on the surface 3 of the body 1. These terminals 4 are desirably consisted of gold-paste and are respectively connected with internal circuits by way of through-holes. The rear face of package body 1 is formed with a stepped portion 5 in which semiconductor device or devices S are positioned. Semiconductor device will be I C, L S I, or other types consisted of semiconductor chips. As shown in FIGS. 2 and 3, the outer peripheral surface 6 of the body 1 is circular shape. While the inner periphery of the body stepped portion 5 and the outer periphery of the cover plate 2 are circular shape, these are not necessarily circular. Also, the respective terminals 4 are adapted to be connected with corresponding connectors or external connecting means.

A paste 8 is applied to a ring-shaped area 7 adjacent the inner periphery of the stepped portion 5 of the body, and a paste 10 is also applied to a similar ring-shaped area 9 adjacent the outer periphery of the cover plate 2. These pastes 8 and 10 are preferably of gold-paste because of high reliability and non-oxidation, while other pastes such as silver-paste may be employed. When the cover plate 2 fits into the stepped portion 5 of the body 1, pastes 8, 10 adhere to each other. This paste to paste combination provides complete seal between the cover plate and the stepped portion of the body, and the resultant sealed condition is resistant against temperature-variations and/or mechanical impacts.

Figure 8:
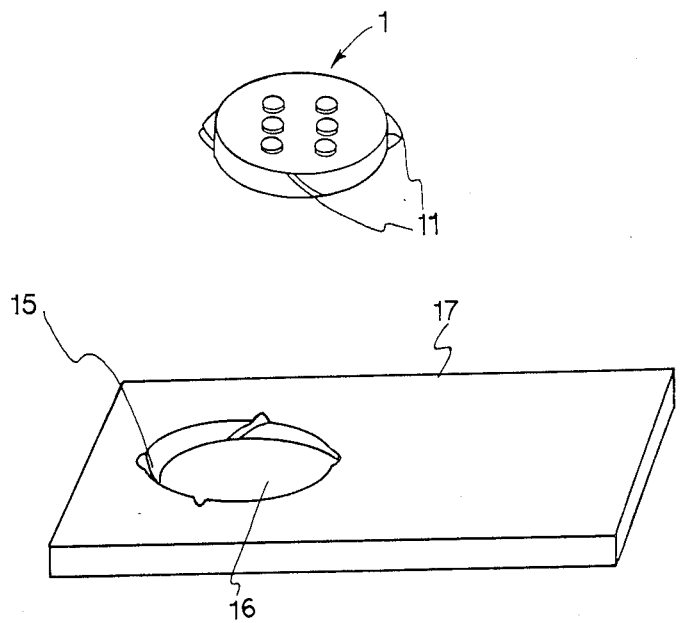
FIG. 8 is an exploded perspective view showing the relationship of the package and the circuit backboard.

In addition, the outer peripheral surface 6 of the body 1 is integrally formed with a plurality of projections 11. The respective projections 11 are adapted to fit into grooves 15 formed in an inner peripheral surface of the opening 16 of a base board 17 as shown in FIG. 8.

Figure 6:
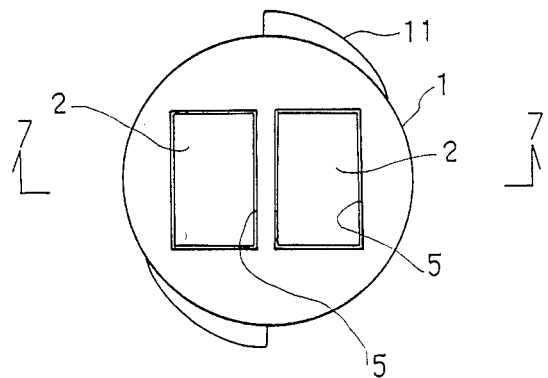
FIG. 6 is a bottom plan view showing a further embodiment of the invention.
Figure 7:
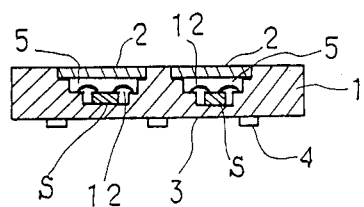
FIG. 7 is an inverted elevational cross-sectional view of a package assembly embodied by the invention.

The package body 1 can be formed with a square stepped portion 5 to which a similar square cover plate 2 is applied, as shown in FIG. 5. Also, as shown in FIGS. 6 and 7, the rear bottom face of the body 1 can be formed with a plurality of stepped portions 5. In this embodiment, the respective stepped portions contain semiconductor device or devices therein. Otherwise, the shape of the cover plate 2 and the stepped portion 5 may be rectangular. In FIG. 7, 12 denotes wiring means consisted of wire bonding, etching lead or the like, which serve to connect semiconductor device or devices with circuits disposed in the body 1.

Thus, the invention enables easy mounting of the package assembly, because it is merely fitted into a circular opening of a base board. When the package assembly is set in position, the surface of the assembly is of the same level with the surface of the base board, and thus the assembly is not relieved from the base board surface. This leads to compactness. Also, because of the disposition of ceramic cover plate into a stepped portion formed in similar ceramic package body, and because of the paste to paste adhesion between the both members, the interior of the package body in which semiconductor devices are positioned, is completely sealed. Therefore, semiconductor device or devices encased in this package assembly do not suffer from atmosphere and moisture. Furthermore, the package assembly of the invention can be disposed both in a printed circuit board and in an identification card, and thus can be used for many applications.

Having now exemplified the invention, it will be apparent to one of ordinary skilled in the art that many changes and modifications can be made thereto without departing from the spirit or scope of the invention as set forth herein.

I claim:

1. A package assembly in which a semiconductor device or devices are enclosed, which comprises
    a ceramic package body comprising a first and second face having a circular periphery adapted to be received in a circular opening formed in a base board, a plurality of connector terminals at the first face of the body and at least one stepped portion at the second face of the body for receiving a semiconductor device or devices therein,
    at least one ceramic cover plate fitted in the stepped portion of the package body,
    a plurality of projections integrally formed on the circular peripheral surface of the body, said projections being adapted to fit in grooves formed in an inner peripheral surface of the opening of the base board,
    a paste applied to a ring-shaped area adjacent the inner periphery of the stepped portion,
    a paste applied to a similar ring-shaped area adjacent the outer periphery of the cover plate, said pastes being adhered to each other when the cover plate fits into the stepped portion, to thereby sealingly attach the cover plate to the stepped portion.

2. A package assembly set forth in claim 1, wherein both said pastes are of gold-paste.

3. A package assembly set forth in claim 1, wherein both said cover plate and said stepped portion of the body are circular.

4. A package assembly set forth in claim 1, wherein both said cover plate and said stepped portion of the body are square or rectangular.

5. A package assembly set forth in claim 1, wherein one stepped portion is formed in the second face of the body and one cover plate is provided.

6. A package assembly set forth in claim 1, wherein a plurality of stepped portions are formed in the second face of the body, and correspondingly a plurality of the cover plates are provided.

* * * * *